United States Patent
Schwertfeger et al.

(10) Patent No.: US 7,178,366 B2
(45) Date of Patent: Feb. 20, 2007

(54) METHOD FOR THE PRODUCTION OF AN INTERNALLY VITRIFIED SIO2 CRUCIBLE

(75) Inventors: Fritz Schwertfeger, Burghausen (DE); Jens Guenster, Clausthal-Zellerfeld (DE); Sven Engler, Clausthal-Zellerfeld (DE); Juergen Heinrich, Clausthal-Zellerfeld (DE)

(73) Assignee: Wacker Chemie AG, Munich (DE)

( * ) Notice: Subject to any disclaimer, the term of this patent is extended or adjusted under 35 U.S.C. 154(b) by 449 days.

(21) Appl. No.: 10/855,126

(22) Filed: May 27, 2004

(65) Prior Publication Data

US 2004/0237588 A1 Dec. 2, 2004

(30) Foreign Application Priority Data

May 28, 2003 (DE) ............... 103 24 440

(51) Int. Cl.
*C03B 19/01* (2006.01)
(52) U.S. Cl. ........................................ 65/17.3
(58) Field of Classification Search ............ 65/17.3, 65/427; 264/497, 428, 434, 603, 605, 671; 219/121.6
See application file for complete search history.

(56) References Cited

U.S. PATENT DOCUMENTS

2003/0104920 A1* 6/2003 Schwertfeger et al. ........ 501/54
2004/0118158 A1* 6/2004 Schwertfeger et al. ....... 65/33.2

FOREIGN PATENT DOCUMENTS

DE 102 60 320 12/2002
DE 101 58 521 6/2003

OTHER PUBLICATIONS

English Derwent Abstract [AN 2003-532490] [50] corresponding to DE 101 58 521 A1.
English translation corresponding to patent application DE 102 60 320.

* cited by examiner

*Primary Examiner*—Steven P. Griffin
*Assistant Examiner*—Queenie Dehghan
(74) *Attorney, Agent, or Firm*—Brooks Kushman P.C.

(57) ABSTRACT

A process for producing an $SiO_2$ shaped body which is at least partially vitrified, wherein an amorphous, porous $SiO_2$ green body is sintered or vitrified by contactless heating by means of radiation, while avoiding contamination to the $SiO_2$ shaped body with foreign atoms, wherein the radiation used is the beam of a laser at a subatmospheric pressure below 1000 mbar.

18 Claims, 4 Drawing Sheets

|—————|
200 μm

Crucible vitrified at standard pressure

|—————|
200 μm

Crucible vitrified at 2 x 10$^{-2}$ mbar

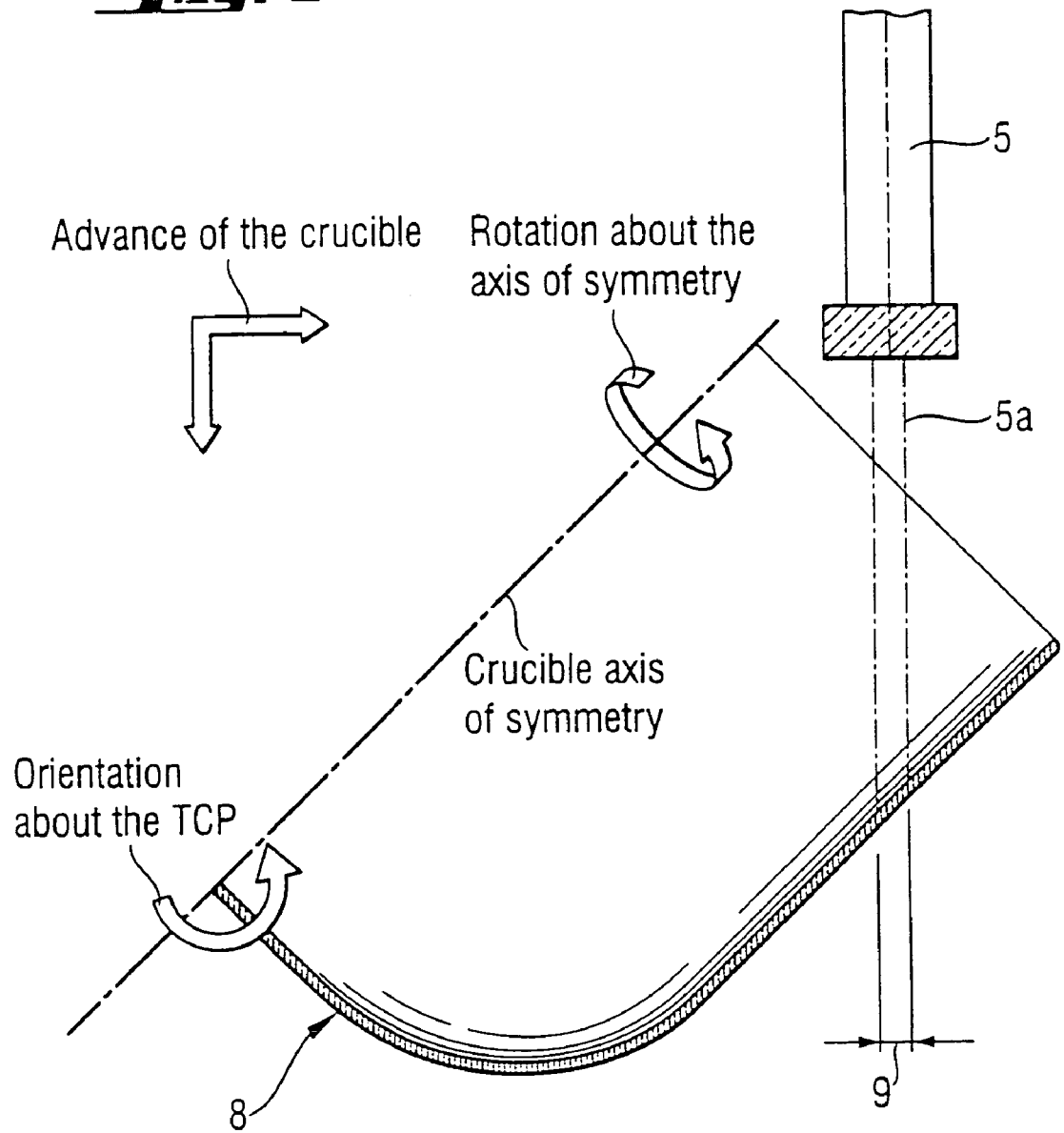

METHOD FOR THE PRODUCTION OF AN INTERNALLY VITRIFIED SIO2 CRUCIBLE

BACKGROUND OF THE INVENTION

1. Field of the Invention

The invention relates to an $SiO_2$ shaped body which is vitrified in partial areas, to a process for producing it, to its use, and also to a device suitable for manufacture of such $SiO_2$ shaped bodies.

2. Background Art

Porous, amorphous $SiO_2$ shaped bodies are used in numerous technical fields. Examples which may be mentioned include filter materials, thermal insulation materials or heat shields.

Furthermore, all kinds of quartz products can be produced from amorphous, porous $SiO_2$ shaped bodies by means of sintering and/or fusion. High-purity porous $SiO_2$ shaped bodies can in this context be used, for example, as preforms for glass fibers or optical fibers. Furthermore, in this way it is also possible to produce crucibles for pulling single crystals, in particular silicon single crystals.

In prior art methods for sintering and/or fusing quartz products, for example, furnace sintering, zone sintering, arc sintering, contact sintering, sintering using hot gases or by means of plasma, the quartz products which are to be sintered and/or fused are heated by the transfer of thermal energy or thermal radiation. If the quartz products produced in this way are to have extremely high purity with regard to any type of foreign atoms, the use of hot gases or hot contact surfaces leads to undesirable contamination to the sintered and/or fused quartz product with such foreign atoms.

Therefore, in principle, contamination with foreign atoms can only be reduced or avoided by non-thermal, contactless heating by means of radiation. Contactless heating by means of radiation under standard pressure is possible, for example by sintering or fusion of an open-pored $SiO_2$ green body with the aid of a $CO_2$ laser beam. However, a significant drawback of this method is the quality of the vitrified regions. If an open-pored porous green body is sintered or fused using a laser beam, a large number of gas inclusions, or as "gas bubbles," are formed. These cannot escape or can only escape with difficulty, on account of the high viscosity of the molten amorphous glass phase. As a result, therefore, the vitrified layer contains a large number of such gas inclusions.

If high-purity quartz glass products such as crucibles used to pull single crystals, in particular silicon single crystals, are produced in this way, the gas inclusions on the inner side of the pulling crucible cause considerable problems during the crystal pulling process with regard to the yield and quality of the silicon single crystal. Furthermore, during the crystal pulling process, gas bubbles originally produced under standard pressure grow to a considerable extent under reduced pressure used during the pulling process. This leads to considerable problems caused by contamination with what is known as CVD cristobalite if the large gas bubbles open up during the pulling process.

SUMMARY OF THE INVENTION

An object of the present invention is to provide a process for producing an $SiO_2$ shaped body which is vitrified in at least partial areas, in which an amorphous, open-pored $SiO_2$ green body is sintered or vitrified by contactless heating by means of a $CO_2$ laser beam and in the process gas inclusions in the sintered or vitrified regions are either produced under reduced pressure or are avoided altogether. These and other objects are achieved by sintering and/or fusing an amorphous, open-pored $SiO_2$ green body under reduced pressure or vacuum by contactless heating by means of a $CO_2$ laser beam.

BRIEF DESCRIPTION OF THE DRAWINGS

FIG. 4 illustrates impingement of a laser beam upon a crucible in cross-section.

DETAILED DESCRIPTION OF THE PREFERRED EMBODIMENT(S)

Figure 1:
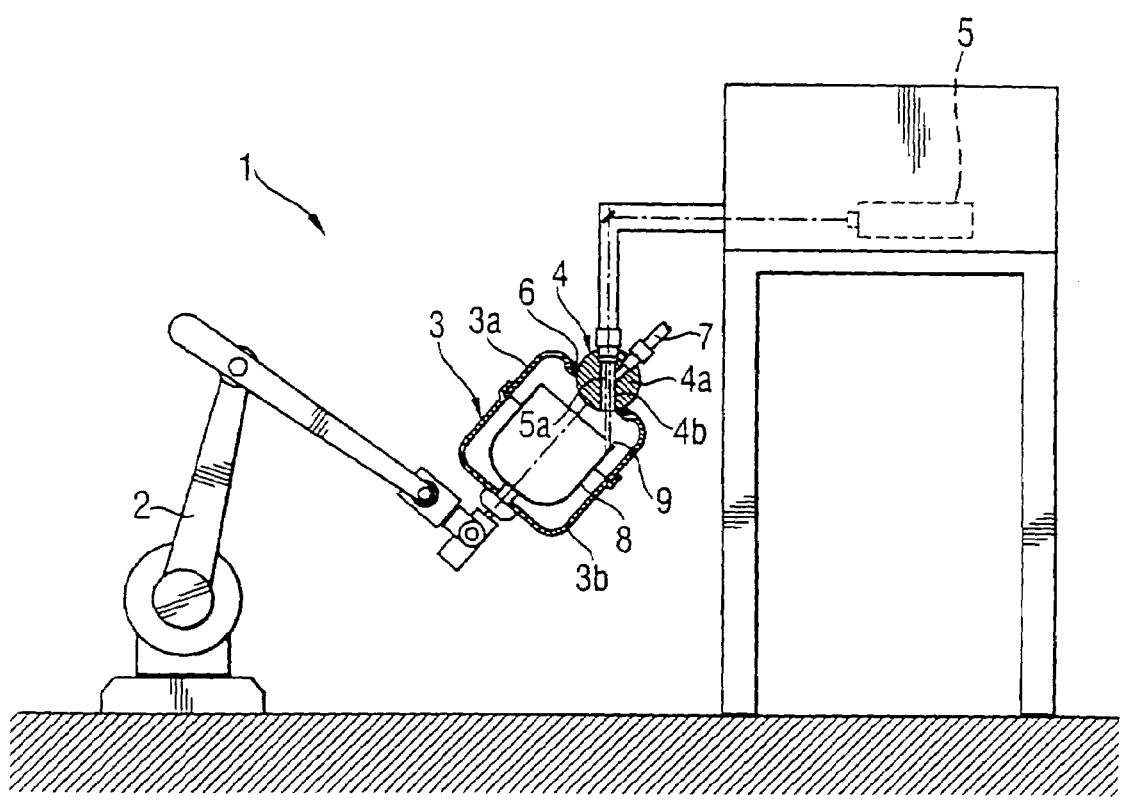
FIG. 1 illustrates one embodiment of vacuum laser sintering in ccordance with the present invention.

These and other objects are achieved by sintering and/or fusing an amorphous, open-pored $SiO_2$ green body under reduced pressure or vacuum by contactless heating by means of a $CO_2$ laser beam.

The subject matter of the invention is thus a process for producing an $SiO_2$ shaped body which is vitrified partially or completely, in which an amorphous, porous $SiO_2$ green body is sintered or vitrified by contactless heating by means of radiation, while avoiding contamination of the $SiO_2$ shaped body with foreign atoms, wherein the radiation used is the beam of a laser at a subatmospheric pressure below 1000 mbar.

The radiative energy which is required for the sintering or vitrification is preferably introduced into the shaped body by means of a $CO_2$ laser, preferably a laser with a beam wavelength which is greater than the absorption edge of the silica glass at 4.2 µm. Most preferably, the laser is a $CO_2$ laser with a beam wavelength of 10.6 µm. Therefore, lasers which are particularly suitable are all commercially available $CO_2$ lasers.

In the context of the present invention, an $SiO_2$ green body is to be understood as meaning a porous, amorphous, open-pored shaped body which has been produced from amorphous $SiO_2$ particles (silica glass) by means of conventional shaping steps. Suitable $SiO_2$ green bodies are in principle, for example, all such bodies which are known from the prior art. Their production is described, for example, in patents EP 705797, EP 318100, EP 653381, DE-A 2218766, GB-B 2,329,893, JP 5294610, and U.S. Pat. No. 4,929,579. $SiO_2$ green bodies whose production is described in DE-A1 19943103 are particularly suitable. The $SiO_2$ green body is preferably in the shape of a crucible.

It is preferable for the inner side and the outer side of the $SiO_2$ green body to be irradiated by a laser beam, preferably with a focal spot diameter of at least 2 cm, and to be sintered or vitrified as a result. The irradiation is preferably carried out with a radiation power density of 50 W to 500 W per square centimeter, preferably 100 $W/cm^2$ to 200 $W/cm^2$ and most preferably, 130 to 180 $W/cm^2$. The power per $cm^2$ must at least be sufficient for a sintering operation to take place.

The irradiation preferably takes place uniformly and continuously on the inner side and/or the outer side of the $SiO_2$ green body. The uniform, continuous irradiation of the inner side and the outer side of the $SiO_2$ green body for sintering or vitrification purposes can in principle be effected by moveable laser optics and/or corresponding movement of the crucible in the laser beam.

The movement of the laser beam can be carried out using all methods which are known to the person skilled in the art, for example by means of a beam-guidance system which allows the laser focus to move in all directions. The movement of the green body in the laser beam can likewise be carried out using all methods which are known to the person skilled in the art, for example by means of a robot. Furthermore, a combination of the two movements is possible. In the case of relatively large shaped bodies, e.g. $SiO_2$ green crucibles, scanning, i.e. a continuous, surface-covering displacement of the specimen beneath the laser focal spot, is preferred.

The thickness of the vitrified inner side or outer side is in principle controlled at any location by the amount of laser power introduced. It is preferable for the thickness of the vitrification of the corresponding side to be as uniform as possible.

On account of the geometry of the $SiO_2$ green body, it may be the case that the laser beam does not always impinge on the surface of the green body at a constant angle during the irradiation of the green body. Since the absorption of the laser radiation is angle-dependent, this results in vitrification with a non-uniform thickness.

Therefore, an additional object of the present invention was to develop a method which allows vitrification of uniform thickness to be achieved. According to the invention, this was achieved by measuring the temperature of the green body in the focal spot of the laser. In this measurement, a proportion of the reflected thermal radiation is transferred via a system of mirrors to a pyrometer which is used for temperature measurement. By incorporating this temperature measurement in the overall system of laser and moving green body, it is possible for one or more of the process variables laser power, displacement path, displacement speed and laser focus to be adjusted during the laser irradiation of the green body in such a way that vitrification of uniform thickness can be achieved.

The $SiO_2$ shaped body which is to be sintered or vitrified is held under a reduced pressure or vacuum throughout the irradiation process. If reduced pressure is used, the pressure is below standard pressure of 1013.25 mbar, more preferably between 0.01 and 100 mbar, and most preferably between 0.01 and 1 mbar. Furthermore, the laser power required when sintering under reduced pressure is approximately 30% lower, since the encapsulation of the specimen in the vacuum chamber leads to less energy being exchanged with the environment.

In a preferred embodiment, sintering, fusing, and/or vitrification is conducted under vacuum, in order to produce glass layers which are completely free of bubbles.

In the case of pulling crucibles used for the process of pulling silicon single crystals, the process is preferably carried out at pressures which are below the pressure at which the single crystal is pulled in the subsequent pulling process. As a result, should a small number of gas bubbles nevertheless be formed, subsequent growth of these bubbles is avoided.

In another preferred embodiment, the $SiO_2$ shaped body which is to be sintered or vitrified is held under a gas atmosphere throughout the entire process. If the gas or gases can readily diffuse in the molten glass, this leads to a significant reduction in the number of gas bubbles. In this context, a helium atmosphere has proven to be a particularly suitable gas, since helium can diffuse particularly easily in molten glass. Of course, a combination of a gas atmosphere and a reduced pressure is also possible. In this context, a reduced helium atmosphere is particularly preferred.

The vitrification or sintering of the surface of the $SiO_2$ green body preferably takes place at (local) temperatures of between 1000 and 2500° C., more preferably between 1300 and 1800° C., most preferably between 1300 and 1600° C.

Conduction of heat from the hot surface of the body into the shaped body, preferably at temperatures of over 1000° C., allows partial to complete sintering of the $SiO_2$ shaped body beyond the vitrified inner layer or outer layer to be achieved.

A further object of the present invention is to provide a process which allows a locally delimited, defined vitrification or sintering of an $SiO_2$ green body. This object is achieved by virtue of the fact that only the inner side or only the outer side of the porous, amorphous $SiO_2$ green body is irradiated in a surface-covering manner with a laser and is thereby sintered or vitrified. Parameters and procedures in this process preferably correspond to those used in the process described above, except for the restriction that only one side of the shaped body is irradiated. According to this aspect of the invention, it is in this way possible for shaped bodies to be vitrified on one side.

The invention exploits the fact that, under reduced pressure or a vacuum, the $SiO_2$ green crucible can be compacted by approx. 20% by volume, and reflow to form glass without the formation of bubbles is possible, since the open porosity of the green body allows gases formed to be released.

On account of the very low thermal conductivity of the silica glass, the process according to the invention can produce a very sharp and defined interface between vitrified and unvitrified regions in the $SiO_2$ shaped body. This leads to $SiO_2$ shaped bodies with a defined sintering gradient. The invention therefore also relates to an $SiO_2$ shaped body which is completely vitrified on the inner side and has open pores on the outer side, and to an $SiO_2$ shaped body which is completely vitrified on the outer side and has open pores on the inner side.

The $SiO_2$ shaped body according to the invention preferably has no more than 40, more preferably no more than 30, yet more preferably no more than 20, particularly no more than 10, yet more particularly no more than 5 and most particularly, no gas bubbles at all per $cm^3$, taken as a mean over the entire area which has been completely vitrified, with the size of the gas bubbles preferably being such so as to not have any bubbles with a diameter larger than 50 µm, more preferably no larger than 30 µm, yet more preferably no larger than 15 µm, still yet more preferably no larger than 10 µm, and very particularly, no larger than 5 µm.

The $SiO_2$ shaped body which is completely vitrified on the inner side and has open pores on the outer side is preferably a silica glass crucible used to pull silicon single crystals using the Czochralski process (CZ process).

It is noted as a further advantage of the subject invention process, that the extreme temperature profile in the $SiO_2$ green body prevents crystallization of the silica glass during the process.

Since in the case of a green body in crucible form which is vitrified on the inner side no shrinkage of the crucible outer side takes place, it is in this way easy to produce near net shape crucibles.

An internally vitrified silica glass crucible is preferably used for pulling single crystals using the CZ process.

It is preferable for the amorphous silica glass crucibles which have been vitrified on the inner side and have open pores on the outer side also to be impregnated in the outer region with substances which induce or accelerate crystallization of the outer regions during the subsequent CZ process, such as barium hydroxide, barium carbonate, barium oxide or aluminum oxide. Substances which are suitable for this purpose as well as impregnation methods suitable for use therewith are known from the prior art and are described, for example, in DE 10156137.

A further subject of the invention is a device for vacuum laser sintering (cf. FIG. 1), which includes a laser, a holding device for the product to be sintered which can move in three axes, the laser and the holding device being configured with a sealing device which allows the holding device to be sealed off with respect to the outside in such a way that a subatmospheric pressure can be formed therein.

The device for vacuum laser sintering may comprise, for example, a bellows, or more preferably, a sealing device which comprises a vacuum chamber and a rotary vacuum device, which are sealed off in a positively locking manner with respect to the outside, so that a subatmospheric pressure can be formed.

A preferred device 1 includes a displacement unit, embodied by a robot 2, a vacuum chamber 3, a rotary vacuum lead through 4, and a $CO_2$ laser 5. The vacuum rotary lead through which connects the vacuum chamber 3 to the beam path 5a of the laser 5 is particularly preferred. The rotary lead through 4 may comprise a ball 4a with a hole 4b which is flanged onto the stationary beam path 5a of the laser 5 in such a manner that the vacuum chamber 3 can move freely in three axes relative to the ball in an airtight manner, preferably by means of a plastic seal 6, such as a Teflon seal. Furthermore, a rotary lead through of this type allows laser radiation to be introduced into the vacuum chamber and allows the latter to be evacuated via a laser introduction window 10 or vacuum connection 7 arranged in a stationary position in the space. A simplified vacuum chamber structure with just one opening, which is sealed with respect to the ball by means of a Teflon seal, is then possible.

Figure 2:
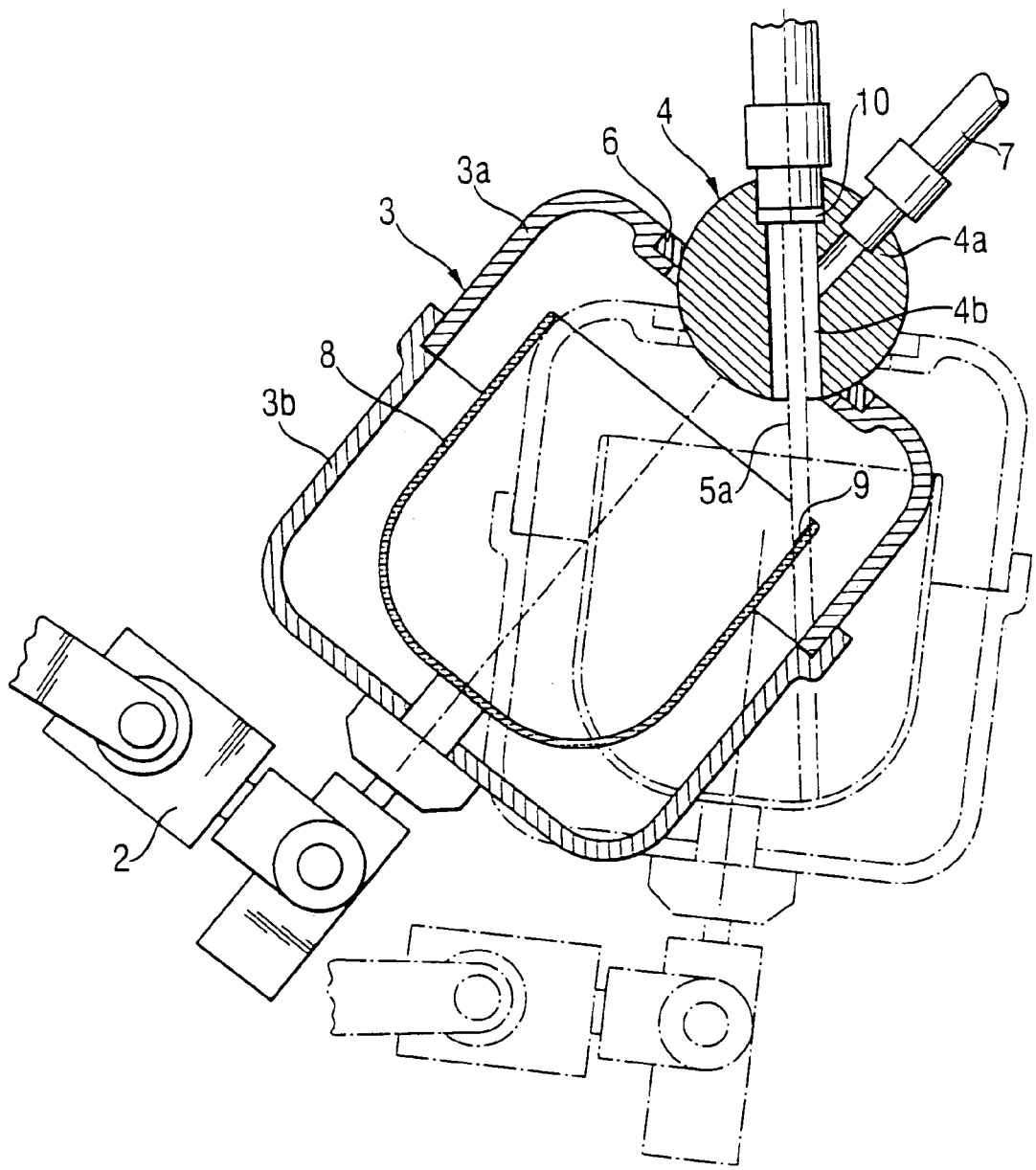
FIG. 2 illustrates an enlarged view of the embodiment of FIG. 1.

To execute the movement which is required in order to scan the $SiO_2$ green body 8 in a surface-covering manner, the vacuum chamber in which the $SiO_2$ green body to be sintered is located, is rotated about the center of the ball in three independent axes by means of a six-axis robot. On account of the geometry of the structure, during surface-covering scanning, the laser radiation does not impinge on the specimen surface at a constant angle (cf. in this respect FIG. 2).

The variation in the angle of incidence, as a process variable, is compensated for, according to the invention, by one or more of means of the process variables: laser power, displacement path, displacement speed, and laser focus during the laser treatment, in such a way that uniform irradiation of the $SiO_2$ specimen is achieved. A pyrometer integrated with the beam path of the laser in this case allows the temperature to be determined in the focal spot 9 of the laser. The temperature determined by means of the pyrometer serves as a control variable for process-integrated power control of the laser during the internal vitrification of the crucible.

An advantage of the structure illustrated is complete decoupling of vacuum chamber and complex parts, such as laser optics, laser introduction window and vacuum connection. Furthermore, in the unevacuated state, the vacuum chamber can easily be detached from the laser optics. The vacuum chamber 3 with rotary lead through 4 is therefore designed in such a way that the sequences of movements required to change the specimen 8 can easily be carried out by the robot 2 itself. Further, it is preferable for the vacuum chamber 3 to be split. If the vacuum chamber comprises at least two parts, simple and if appropriate semi-automated or fully automated loading and unloading of the vacuum chamber are possible.

Figure 3A:
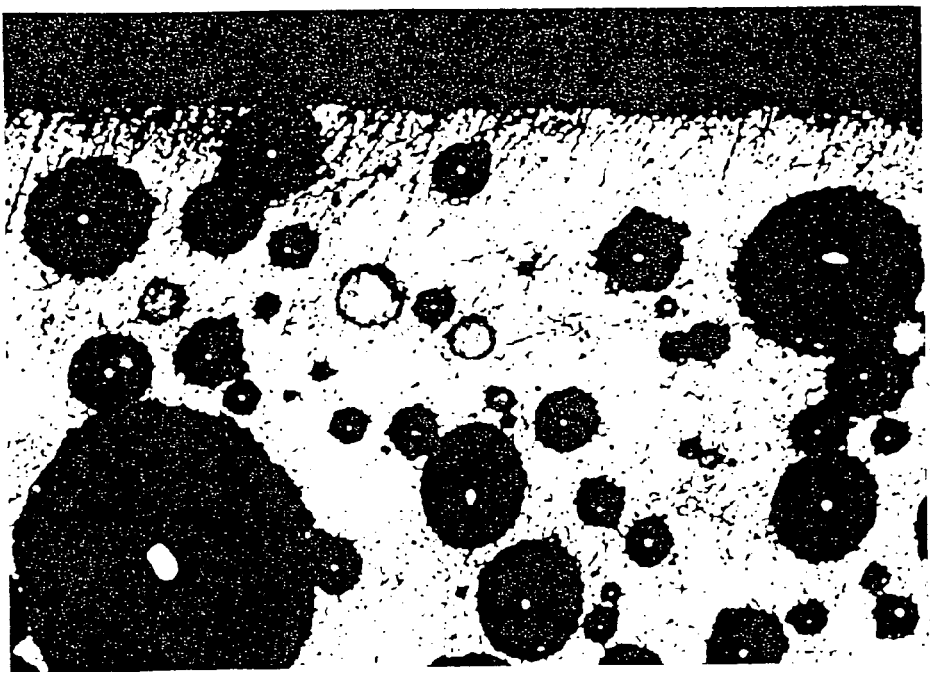
FIGS. 3a and 3b illustrate the differences in gas inclusions in crucibles vitrified under standard pressure (3a) and reduced pressure (3b).

In the simplest case, the vacuum chamber 3 comprises an upper half 3a and a lower half 3b. After a new $SiO_2$ specimen has been inserted into the lower half 3b of the vacuum chamber 3, the former is plug-fitted to the upper half 3a of the vacuum chamber 3 without the need for additional screw connections or flanged connections, and the two halves are then moved to the ball 4a and evacuated. The structure is stabilized by the evacuation itself, without forces being transmitted to the beam path of the laser or the robot. FIG. 3 compares the cross section of a specimen which has been sintered under standard pressure (a) with a vacuum-sintered specimen (b). A markedly more pronounced formation of bubbles is clearly apparent in the specimen which has been sintered under standard pressure. Furthermore, this specimen, unlike the vacuum-sintered specimen, does not appear transparent.

The glass layer thickness is approximately identical for both specimens given the same process duration, but the laser power required is approximately 30% lower in the case of vacuum sintering. This can be attributed to the fact that the specimen is encapsulated in the vacuum chamber, leading to less energy being exchanged with the environment.

Having generally described this invention, a further understanding can be obtained by reference to certain specific examples which are provided herein for purposes of illustration only and are not intended to be limiting unless otherwise specified.

EXAMPLE 1

Production of an Open-pored, Porous, Amorphous $SiO_2$ Green Body in Crucible Form Production was based on the process described in DE-A1 19943103. High-purity fumed and fused silica were dispersed homogeneously, without bubbles and without metal contamination, in double-distilled $H_2O$ in vacuo with the aid of a plastic-coated mixer. The dispersion produced in this way had a solids content of 83.96% by weight (95% fused silica and 5% fumed silica). The dispersion was shaped into a 14" crucible in a plastic-coated outer mold by means of the roller process which is in widespread use in the ceramics industry. After initial drying of 1 hour at a temperature of 80° C., it was possible for the crucible to be demolded and then fully dried over the course of 2 hours at approximately 90° C. in a microwave oven. The dried open-pored crucible green body had a density of approx. 1.62 g/cm$^3$ and a wall thickness of 9 mm.

EXAMPLE 2

COMPARATIVE EXAMPLE

Internal Vitrification of a 14" Green Crucible from Example 1.

The 14" green crucible from Example 1 was irradiated by means of an ABB robot (type IRB 2400) in the focus of a $CO_2$ laser (type TLF 3000 Turbo) with a radiation power of 3 kW.

The laser was equipped with a rigid beam-guidance system, and all degrees of freedom of movement were provided by the robot. In addition to a diverting mirror which diverts the radiation, which emerges horizontally from the laser resonator, into the vertical, the laser was equipped with optics for widening the primary beam. The primary beam had a diameter of 16 mm. After the parallel primary beam had passed the widening optics, a divergent beam path resulted. The focal spot on the 14" crucible had a diameter of 50 mm given a distance of approx. 450 mm between optics and crucible (cf. FIG. 1). The robot was controlled by means of a program matched to the crucible geometry. On account of the rotationally symmetrical shape of the crucible, it was possible to restrict the degrees of freedom of the displacement to one plane plus two axes of rotation (cf. FIG. 4). With the crucible 8 rotating (angular velocity 0.15°/s), first of all the upper edge of the crucible was covered by the focal spot 9 over an angular range of 375°. Then, the remainder of the inner surface of the crucible was moved over by the laser helically. The rotational speed and speed of advance of the crucible on an axis from the crucible edge to the center were accelerated in such a way that the area covered per unit time was constant. Irradiation took place at 150 W/cm$^2$. In the same process step, in addition to the vitrification of the surface of the green body, the $SiO_2$ shaped body was partially sintered as a result of heat conduction from the hot inner surface into the interior of the shaped body. After the laser irradiation, the $SiO_2$ crucible has been vitrified on the inner side over a thickness of 3 mm, in a surface-covering manner and without cracks, while retaining its original external geometry. However, the glass layer has a large number of large and small air bubbles and is therefore also not transparent (cf. FIG. 3).

EXAMPLE 3

Internal Vitrification of a 14" Green Crucible in Accordance with the Invention.

A 14" green crucible from Example 1 was vitrified on the inner side in a special vacuum laser installation.

Figure 3B:
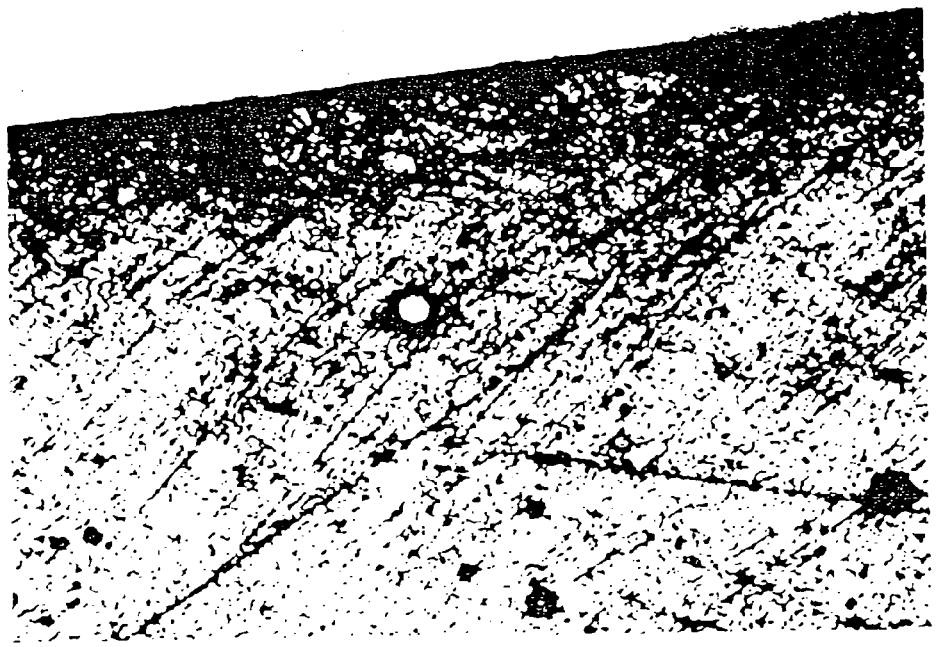

The vacuum laser installation substantially comprises a displacement unit, produced by an ABB robot (type IRB 2400), a vacuum chamber, a rotary vacuum lead through and a $CO_2$ laser (type TLF 3000 Turbo) with a radiation power of 3 kW (cf. FIG. 1). The rotary vacuum lead through in this case connects the vacuum chamber, which can move freely in three axes, to the laser optics. Before the internal vitrification by means of the $CO_2$ laser, the vacuum chamber was evacuated to a pressure of $2 \cdot 10^{-2}$ mbar. Then, the 14" green crucible was moved analogously to Example 2 by means of the robot and sintered in a surface-covering manner on the inner side by means of the $CO_2$ laser. On account of the geometry of the structure, during surface-covering scanning, the laser radiation does not impinge on the specimen surface at a constant angle (cf. FIG. 4). In order nevertheless to achieve uniform vitrification, a pyrometer integrated with the beam path of the laser was used to determine the focal spot temperature during the process, and this measurement was used as a control variable for process-integrated control of the power of the laser. In addition to the vitrification of the inner-side surface of the green body, the $SiO_2$ shaped body was partially sintered on account of the conduction of heat from the hot inner surface into the interior of the shaped body. After the laser irradiation, the $SiO_2$ crucible is in a vitrified state, without cracks, in a manner which covers its inner surface, to a thickness of 3 mm, while retaining its original external geometry. The glass layer has only a few, relatively small air bubbles (cf. FIG. 3b compared to FIG. 3a). Therefore, unlike the crucible produced in Example 2, the vitrified layer is transparent.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for the production of a crack-free, internally vitrified $SiO_2$ crucible, comprising:
   sintering an amorphous, open-pored $SiO_2$ green-body crucible by means of exposure to a focal spot of a $CO_2$ laser beam, wherein the focal spot is moved relative to the inner surface of said crucible throughout the sintering, the sintering beginning at an upper inner edge of the $SiO_2$ green-body crucible by means of a focal spot of a first contact area, the focal spot sweeping over the upper inner edge of the $SiO_2$ green-body crucible and broadening during said sweeping to a second, larger contact area until the upper inner edge is fully vitrified, the focal spot then moving into the $SiO_2$ green-body crucible, an upper edge of said second contact area traversing the inner surface of said crucible proximate a lower edge of the prior path of said focal spot.

2. The method of claim 1, wherein the laser beam has a power of between 3 kW and 20 kW, and the focal-spot size of the second, larger contact area, is between 2 cm and 20 cm.

3. The method of claim 1, wherein the laser beam has a power of between 10 kW and 20 kW, and the focal-spot size of the second, larger contact area, is between 8 cm and 20 cm.

4. The method as of claim 1, wherein the laser beam contacts the inner surface with a radiation power density of from 50 W to 500 W per square centimeter.

5. The method as of claim 1, wherein the laser beam contacts the inner surface with a radiation power density of from 100 W to 200 W per square centimeter.

6. The method of claim 1, wherein the $SiO_2$ green-body crucible is exposed over its entire inner surface.

7. The method of claim 1, wherein the broadening of the laser beam to its second contact area focal-spot size takes place within one fourth of a rotation to within one full rotation of the green-body crucible.

8. The method of claim 1, wherein the broadening of the laser beam to its second contact area focal-spot size takes place within one fourth to one half of a rotation of the green-body crucible.

9. The method of claim 1, wherein the exposure of the crucible inner surface is carried out at an angular velocity of from 0.1°/s to 0.7°/s.

10. The method of claim 1, wherein the $SiO_2$ green-body crucible is rotated with a constant distance of the laser focal spot from the upper edge of the crucible until a complete rotation (360°) of the crucible has been completed, and the rest of the inner surface of the crucible is subsequently covered surface-wide in the shape of a helix, extending from the edge of the crucible to the center of the crucible bottom, the focal spot moving continuously into the $SiO_2$ green-body crucible.

11. The method of claim 1, wherein the $SiO_2$ green-body crucible is rotated with a constant distance of the laser focal spot from the upper edge of the crucible until a complete rotation (360°) of the crucible has been completed, and the rest of the inner surface of the crucible is subsequently covered surface-wide in the shape of a helix, extending from the edge of the crucible to the center of the crucible bottom, the focal spot moving stepwise into the $SiO_2$ green-body crucible.

12. The method of claim 1, wherein the sintering of the $SiO_2$ green-body crucible is carried out at a temperature of between 1000 and 2500° C.

13. The method of claim 1, wherein the sintering of the $SiO_2$ green-body crucible is carried out at a temperature of between 1300 and 1800° C.

14. The method of claim 1, wherein the sintering of the $SiO_2$ green-body crucible is carried out at a temperature of between 1400 and 1600° C.

15. The method of claim 1, wherein the $SiO_2$ green-body crucible is exposed to said laser beam at a reduced pressure.

16. The method of claim 1, wherein the $SiO_2$ green-body crucible is exposed to said laser beam at between 0.01 and 100 mbar.

17. The method of claim 1, wherein the $SiO_2$ green-body crucible is exposed to said laser beam at between 0.01 and 1 mbar.

18. The method of claim 1, wherein an upper portion of the contact area of the focal spot of the laser with the inner surface of the crucible overlaps an immediately previous lower portion of a contact area of a preceding relative rotation of said focal spot and said inner surface of said crucible by from 10% to 30% of a diameter of the focal spot.

* * * * *